United States Patent
Bright et al.

(10) Patent No.: US 8,248,289 B2
(45) Date of Patent: Aug. 21, 2012

(54) POWER AND AREA EFFICIENT INTERLEAVED ADC

(75) Inventors: William J. Bright, Dallas, TX (US); Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 119 days.

(21) Appl. No.: 12/868,539

(22) Filed: Aug. 25, 2010

(65) Prior Publication Data

US 2012/0050081 A1 Mar. 1, 2012

(51) Int. Cl.
*H03M 1/34* (2006.01)

(52) U.S. Cl. ........ 341/162; 370/516; 375/327; 348/572; 327/175

(58) Field of Classification Search .......... 341/120–155; 370/516; 375/327; 348/572, 705; 369/44.26, 369/44.29, 44.28, 44.39, 116, 121; 345/101, 345/102; 327/175

See application file for complete search history.

(56) References Cited

U.S. PATENT DOCUMENTS

| | | | |
|---|---|---|---|
| 3,059,228 A | 10/1962 | Beck et al. | |
| 3,735,392 A | 5/1973 | Kaneko | |
| 3,820,112 A | 6/1974 | Roth | |
| 5,180,932 A | 1/1993 | Bengel | |
| 5,391,936 A | 2/1995 | Soh | |
| 6,094,153 A * | 7/2000 | Rumsey et al. | 341/155 |
| 6,407,687 B2 | 6/2002 | Martin et al. | |
| 7,126,515 B1 * | 10/2006 | Kris | 341/141 |
| 7,206,062 B2 * | 4/2007 | Asbrock et al. | 356/4.03 |
| 7,474,235 B2 * | 1/2009 | Hsieh et al. | 341/61 |
| 7,477,173 B2 * | 1/2009 | Hayakawa et al. | 341/108 |
| 7,480,012 B1 * | 1/2009 | Greenberg | 348/572 |
| 7,911,891 B2 * | 3/2011 | Liao et al. | 369/44.29 |
| 2001/0050624 A1 | 12/2001 | Nagaraj | |
| 2001/0052864 A1 * | 12/2001 | Shimizu et al. | 341/141 |
| 2007/0001891 A1 | 1/2007 | Mazhar | |

FOREIGN PATENT DOCUMENTS

| | | |
|---|---|---|
| KR | 1020010041292 | 5/2001 |
| KR | 1020080085797 | 9/2008 |

OTHER PUBLICATIONS

PCT Search Report mailed Sep. 29, 2011.

* cited by examiner

*Primary Examiner* — Lam T Mai

(74) *Attorney, Agent, or Firm* — John J. Patti; Wade J. Brady, III; Frederick J. Telecky, Jr.

(57) ABSTRACT

Pipeline analog-to-digital converters (ADCs) are commonly used for high frequency applications; however, operating at high sampling rates will often result in high power consumption or tight timing constraints. Here, though, an ADC is provided that allows for relaxed timing (which enables a high sampling rate) with low power consumption. This is accomplished through the use of multiplexed, front-end track-and-hold (T/H) circuits that sample on non-overlapping portions of a clocking signal in conjunction with "re-used" or shared analog processing circuitry.

12 Claims, 3 Drawing Sheets

POWER AND AREA EFFICIENT INTERLEAVED ADC

TECHNICAL FIELD

The invention relates generally to analog-to-digital converters (ADCs) and, more particularly, to interleaved ADCs.

BACKGROUND

High performance ADCs do not typically follow the "Moore's Law" area and power curves achieved by digital circuits in scaling CMOS process technology. The noise and resolution specifications of an ADC dictate power constraints (lower noise requires higher power) and area limits (to exceed component matching requirements). In addition, as the sampling rates of ADCs increase, typical architectures fail to deliver the required performance due to timing limitations.

Referring to FIG. 1A of the drawings, reference numeral 100 generally designates a conventional ADC 100. ADC 100 generally comprises several stages 102-1 to 102-N, an ADC 106 (which is typically a flash ADC), and a digital output circuit 104. The stages 102-1 to 102-N are generally coupled in series with one another in a sequence, where the first stage 102-1 receives the analog input signal and where each of the subsequent stages 102-2 to 102-N receives a residue signal from the previous stage 102-1 to 102-(N−1), respectively. ADC 106 is coupled to the last stage 102-N (receiving its residue signal). Based on its input signal (either a residue signal or the analog input signal), stages 102-1 to 102-N and ADC 106 are able to resolve a portion of the analog input signal, which is provided to digital output circuit 104. Digital output circuit 104 can then perform error correction or other digital processing to generate the digital output signal DOUT.

Turning now to FIGS. 1B and 1C, stages 102-1 to 102-N can be seen in greater detail (which are referred to hereinafter as stage 102 for the sake of simplicity). Stage 102 generally comprises a track-and-hold (T/H) circuit 108 (i.e., T/H amplifier), ADC 110, digital-to-analog converter (DAC) 112, adder 114, and a residue amplifier 116. In operation, the T/H circuit 110 enters a track phase T during the logic high state of the clock signal CLK and a hold phase H during the logic low state of the clock signal CLK. During the track phase T, the T/H circuit samples its analog input signal SIN (which may be the analog input signal AIN or the residue signal from the previous stage). During the hold phase H, the sampled signal is provided to ADC 110 and adder 114. The ADC 110 resolves a portion of the signal SIN, providing the resolved bits to digital output circuit 104 and DAC 112. DAC 112 converts the resolved bits to an analog signal which is provided to adder 114. Adder 114 determines the difference between the sampled signal and the analog signal from DAC, which is amplified by amplifier 116 and output as a residue signal ROUT.

There are some drawbacks to ADC 100. In particular, timing can disadvantage the performance. In operation, analog processing (quantization by ADC 110 and DAC 112, subtraction by adder 114, and amplification by amplifier 116) occurs within a very tight time, namely within one-half of the period of the clock signal CLK (which operates as a sampling clock). While ADC 100 is well-suited for low noise systems, it is generally limited to low sampling rates to allow for sufficient time for analog processing.

Turning to FIGS. 2A through 2C, another example of a conventional ADC 200 can be seen. ADC 200 has the same general functionality as ADC 100. However, a difference exists in the pipeline; namely, stages 102-1 to 102-N have been replaced by stages 202-1 to 202-N and input amplifier 204. A difference between stage 102 (of FIG. 1B) and stage 202-1 to 202-N (hereinafter 202) is that an additional T/H circuit 206 is interposed between T/H circuit 108 and adder 114. T/H circuits 108 and 206 enter track phases T and hold phases H in opposite logic states of clock signal CLK. This arrangement allow for relaxed timing because a sampled signal is held for an entire period of the clock signal CLK, but the addition of T/H circuit 206 adds noise (i.e., about 3 dB per T/H circuit 206). To compensate for noise degradation, the power consumption for each T/H circuit 108 and 206 is doubled, resulting in four times the power consumption of the single T/H system.

Therefore, there is a need for an improved ADC.

Some examples of other conventional circuits are: U.S. Pat. No. 3,059,228; U.S. Pat. No. 3,735,392; U.S. Pat. No. 3,820,112; U.S. Pat. No. 5,180,932; and U.S. Pat. No. 5,391,936.

SUMMARY

A preferred embodiment of the present invention, accordingly, provides an apparatus. The apparatus comprises a plurality of track-and-hold (T/H) circuits that receive an analog input signal; a multiplexer that is coupled to each of the T/H circuits; an analog-to-digital converter (ADC) that is coupled to the multiplexer; and a clocking circuit that receives a clock signal and that is coupled to each of the T/H circuits and the multiplexer, wherein the clocking circuit controls the T/H circuits such that tracking phases for the T/H circuits are generally non-overlapping, and wherein the clocking circuit controls the coupling between each T/H circuit and the ADC with the multiplexer.

In accordance with a preferred embodiment of the present invention, the apparatus further comprises a digital-to-analog converter (DAC) that is coupled to the ADC; an adder that is coupled to the DAC and the multiplexer so as to determine the difference between output signals of the DAC and multiplexer; and an amplifier that is coupled to the adder.

In accordance with a preferred embodiment of the present invention, the clock circuit further comprises a clock divider.

In accordance with a preferred embodiment of the present invention, an apparatus is provided. The apparatus comprises a plurality of stages that are coupled in series with one another in a sequence, wherein the first stage of the sequence receives an analog input signal, and wherein each stage outputs a residue signal, and wherein each stage includes: a plurality of T/H circuits that receive the analog input signal or the residue signal from the previous stage; a multiplexer that is coupled to each of the T/H circuits; and a first ADC that is coupled to the multiplexer; and a clocking circuit that receives a clock signal and that is coupled to each of the T/H circuits and the multiplexer, wherein the clocking circuit controls the T/H circuits such that tracking phases for the T/H circuits for each stage are generally non-overlapping, and wherein the clocking circuit controls the coupling between each T/H circuit for each stage and each first ADC with the multiplexer for each stage; a second ADC that is coupled to the last stage of the sequence so as to receive its residue signal; and a digital output circuit that is coupled to each stage and the second ADC so as to generate a digital output signal.

In accordance with a preferred embodiment of the present invention, an apparatus is provided. The apparatus comprises a plurality of stages that are coupled in series with one another in a sequence, wherein the first stage of the sequence receives an analog input signal, and wherein each stage outputs a residue signal, and wherein each stage includes: a first T/H circuit that receives the analog input signal or the residue signal from the previous stage; a second T/H circuit that receives the analog input signal or the residue signal from the previous stage; a multiplexer that is coupled to the first and second T/H circuits; and a first ADC that is coupled to the multiplexer; and a clocking circuit that receives a clock signal and that is coupled to each of the T/H circuits and the multiplexer, wherein the clocking circuit controls the T/H circuits such that tracking phases for the T/H circuits for each stage are generally non-overlapping, and wherein the clocking circuit controls the coupling between each T/H circuit for each stage and each first ADC with the multiplexer for each stage; a second ADC that is coupled to the last stage of the sequence so as to receive its residue signal; and a digital output circuit that is coupled the each stage and the second ADC so as to generate a digital output signal.

In accordance with a preferred embodiment of the present invention, each stage further comprises: a DAC that is coupled to the first ADC; an adder that is coupled to the DAC and the multiplexer so as to determine the difference between output signals of the DAC and multiplexer; and an amplifier that is coupled to the adder.

In accordance with a preferred embodiment of the present invention, the clock divider is a divide-by-2 clock divider so as to generate a halved clock signal at one half the frequency.

In accordance with a preferred embodiment of the present invention, each first T/H circuit is in its track phase when the halved clock signal is in a first logic state and in its hold phase in when the halved clock signal is in a second logic state, and wherein each first T/H circuit is coupled to its first ADC through its multiplexer when the halved clock signal is in the second logic state.

In accordance with a preferred embodiment of the present invention, each second T/H circuit is in its hold phase when the halved clock signal is in the first logic state and in its track phase when the halved clock signal is in the second logic state, and wherein each second T/H circuit is coupled to its first ADC through its multiplexer when the halved clock signal is in the first logic state.

In accordance with a preferred embodiment of the present invention, the first logic state is logic high, and wherein the second logic state is logic low.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
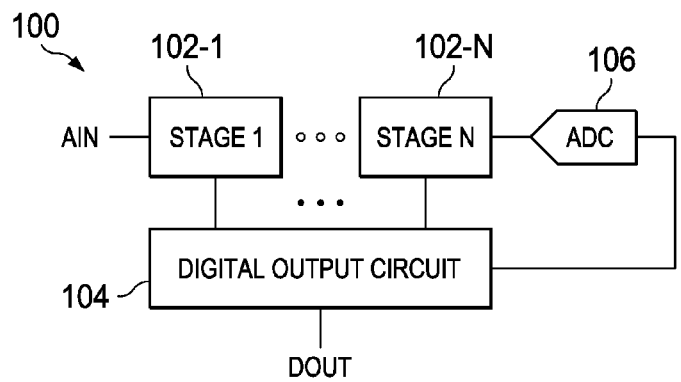
FIGS. 1A and 1B are circuit diagrams for an example of a conventional ADC.
Figure 1B:
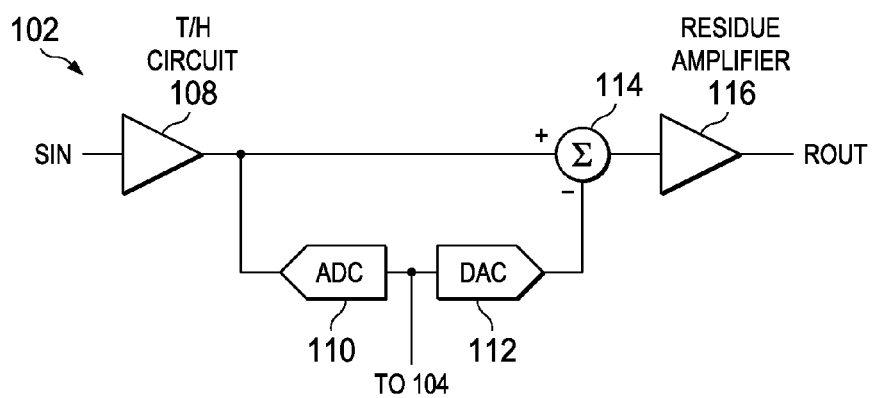
Figure 1C:
FIG. 1C is a timing diagram for the ADC of FIGS. 1A and 1B.
Figure 2A:
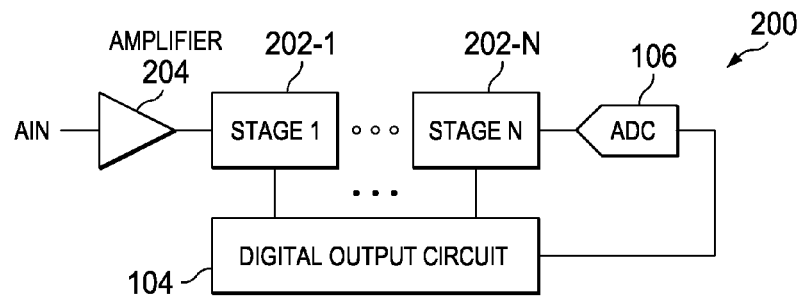
FIGS. 2A and 2B are circuit diagrams for an example of a conventional ADC.
Figure 2B:
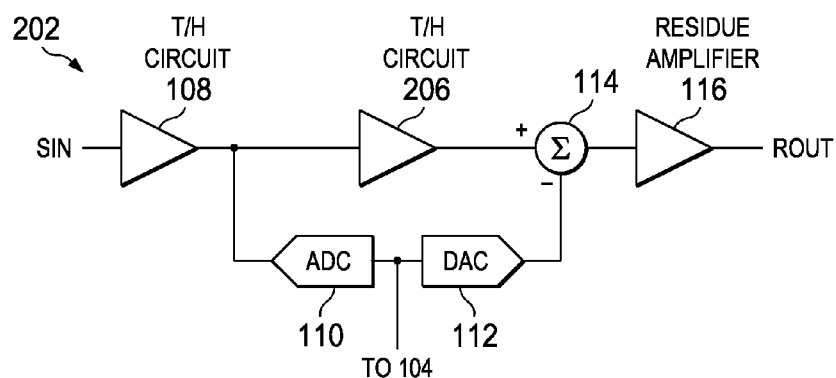
Figure 2C:
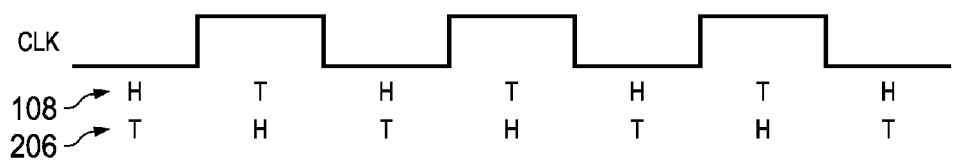
FIG. 2C is a timing diagram for the ADC of FIGS. 2A and 2B.

Refer now to the drawings wherein depicted elements are, for the sake of clarity, not necessarily shown to scale and wherein like or similar elements are designated by the same reference numeral through the several views.

Figure 3A:
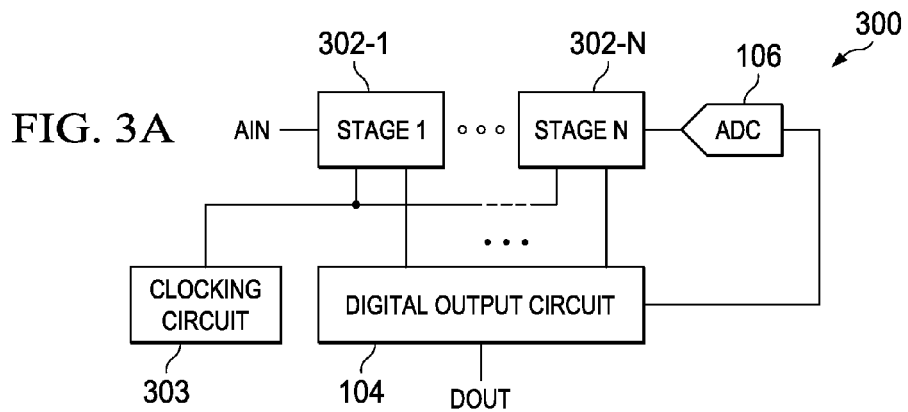
FIGS. 3A and 3B are circuit diagrams for an example of an ADC in accordance with a preferred embodiment of the present invention.

Turning to FIG. 3A, another example of an ADC 300 in accordance with a preferred embodiment of the present invention can be seen. ADC 300 has the same general functionality as ADC 100. However, a difference exists in the pipeline; namely, stages 102-1 to 102-N have been replaced by stages 302-1 to 302-N and clocking circuit 303.

Figure 3B:
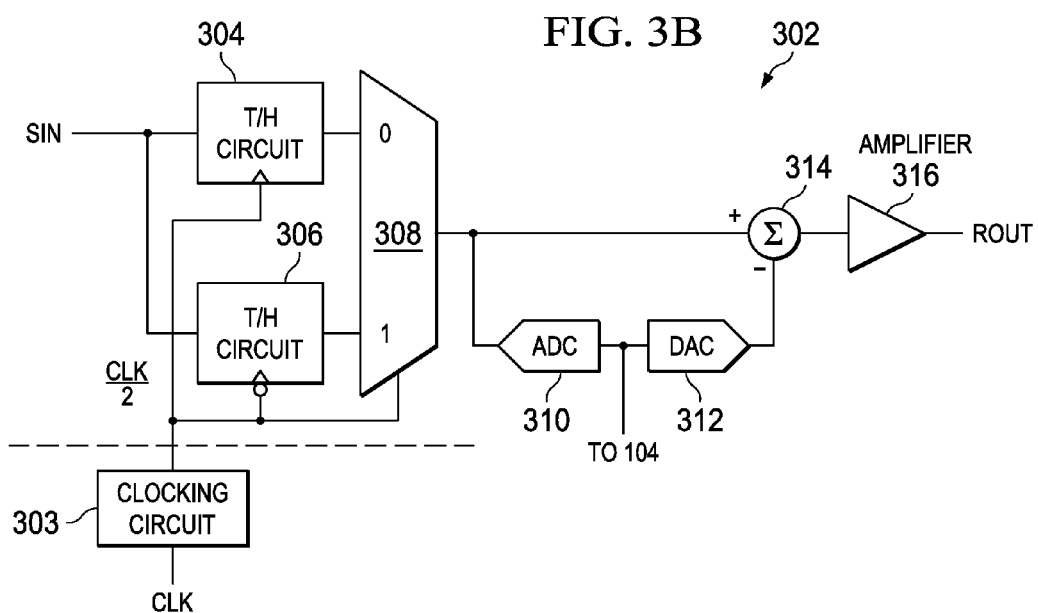
Figure 3C:
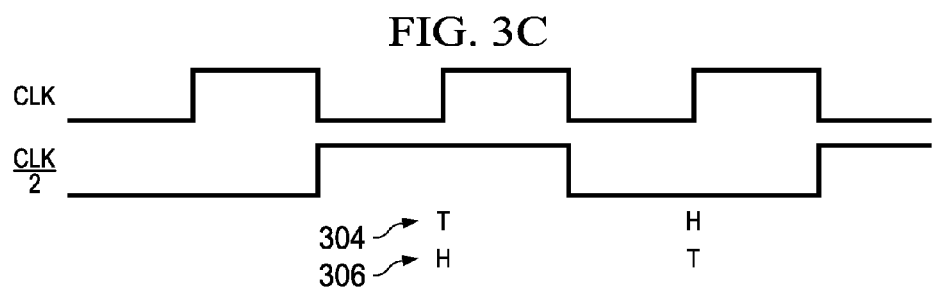
FIG. 3C is a timing diagram for the ADC of FIGS. 3A and 3B.

Looking to FIGS. 3B and 3C, stages 302-1 to 203-N (hereinafter 302) can be seen in greater detail. In operation, T/H circuit 304 and 306 are coupled to receive an analog input signal (either the analog input signal AIN or a residue signal from the previous stage). Since these T/H circuits 304 and 306 are arranged in parallel with one another, T/H circuits 304 and 306 can be timed so as to sample on generally non-overlapping logic stages or phases of a clock signal. Preferably, clocking circuit 303 generally comprises a clock divider (i.e., divide-by-2 clock divider) to generate a halved clock signal CLK/2. This halved clock signal CLK/2 can be provided to T/H circuits 304 and 306 where the T/H circuits 304 and 306 enter track phases T and hold phases H on opposite logic levels of halved clock signal CLK/2. Additionally, the halved clock signal CLK/2 can be provided to multiplexer 308 so as to operate as a select signal so that, when T/H circuits 304 and 306 is in their respective hold phases H, T/H circuits 304 and 306 are respectively coupled to ADC 310 through multiplexer 308. ADC 310, DAC 312, adder 314, and amplifier 316 can then perform analog processing to resolve sampled signals for digital output circuit 104 and to generate a residue signal ROUT.

Effectively, the configuration of ADC 300 operates as a two way (for example) interleaved ADC, which results in the realization of several benefits. By interleaving T/H circuits 304 and 306 at one-half of the sampling rate (i.e., set by clock signal CLK), both relaxed timing and low power consumption (compared to ADCs 100 and 200) can be achieved. Moreover, because ADC 310, DAC 312, adder 314, and amplifier 316 are shared or "re-used," ADC 310, DAC 312, adder 314, and amplifier 316 can be fully utilized instead of remaining idle for part of the time (i.e., one-half of the time), as with an non-interleaved designs. Additionally, because of the re-use of ADC 310, DAC 312, adder 314, and amplifier 316, the amount of area used can be reduced.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a plurality of track-and-hold (T/H) circuits that receive an analog input signal;
   a multiplexer that is coupled to each of the T/H circuits;
   an analog-to-digital converter (ADC) that is coupled to the multiplexer;
   a clocking circuit that receives a clock signal and that is coupled to each of the T/H circuits and the multiplexer, wherein the clocking circuit controls the T/H circuits such that tracking phases for the T/H circuits are generally non-overlapping, and wherein the clocking circuit controls the coupling between each T/H circuit and the ADC with the multiplexer;
   a digital-to-analog converter (DAC) that is coupled to the ADC;
   an adder that is coupled to the DAC and the multiplexer so as to determine the difference between output signals of the DAC and multiplexer; and
   an amplifier that is coupled to the adder.

2. The apparatus of claim 1, wherein the clock circuit further comprises a clock divider.

3. An apparatus comprising:
   a plurality of stages that are coupled in series with one another in a sequence, wherein the first stage of the sequence receives an analog input signal, and wherein each stage outputs a residue signal, and wherein each stage includes:
      a plurality of T/H circuits that receive the analog input signal or the residue signal from the previous stage;
      a multiplexer that is coupled to each of the T/H circuits; and
      a first ADC that is coupled to the multiplexer; and
      a clocking circuit that receives a clock signal and that is coupled to each of the T/H circuits and the multiplexer, wherein the clocking circuit controls the T/H circuits such that tracking phases for the T/H circuits for each stage are generally non-overlapping, and wherein the clocking circuit controls the coupling between each T/H circuit for each stage and each first ADC with the multiplexer for each stage;
   a second ADC that is coupled to the last stage of the sequence so as to receive its residue signal; and
   a digital output circuit that is coupled the each stage and the second ADC so as to generate a digital output signal.

4. The apparatus of claim 3, wherein each stage further comprises:
   a DAC that is coupled to the first ADC;
   an adder that is coupled to the DAC and the multiplexer so as to determine the difference between output signals of the DAC and multiplexer; and
   an amplifier that is coupled to the adder.

5. The apparatus of claim 4, wherein the clock circuit further comprises a clock divider.

6. An apparatus comprising:
   a plurality of stages that are coupled in series with one another in a sequence, wherein the first stage of the sequence receives an analog input signal, and wherein each stage outputs a residue signal, and wherein each stage includes:
      a first T/H circuit that receives the analog input signal or the residue signal from the previous stage;
      a second T/H circuit that receives the analog input signal or the residue signal from the previous stage;
      a multiplexer that is coupled to the first and second T/H circuits; and
      a first ADC that is coupled to the multiplexer; and
      a clocking circuit that receives a clock signal and that is coupled to each of the T/H circuits and the multiplexer, wherein the clocking circuit controls the T/H circuits such that tracking phases for the T/H circuits for each stage are generally non-overlapping, and wherein the clocking circuit controls the coupling between each T/H circuit for each stage and each first ADC with the multiplexer for each stage;
   a second ADC that is coupled to the last stage of the sequence so as to receive its residue signal; and
   a digital output circuit that is coupled the each stage and the second ADC so as to generate a digital output signal.

7. The apparatus of claim 6, wherein each stage further comprises:
   a DAC that is coupled to the first ADC;
   an adder that is coupled to the DAC and the multiplexer so as to determine the difference between output signals of the DAC and multiplexer; and
   an amplifier that is coupled to the adder.

8. The apparatus of claim 7, wherein the clock circuit further comprises a clock divider.

9. The apparatus of claim 8, wherein the clock divider is a divide-by-2 clock divider so as to generate a halved clock signal.

10. The apparatus of claim 9, wherein each first T/H circuit is in its track phase when the halved clock signal is in a first logic state and in its hold phase in when the halved clock signal is in a second logic state, and wherein each first T/H circuit is coupled to its first ADC through its multiplexer when the halved clock signal is in the second logic state.

11. The apparatus of claim 10, wherein each second T/H circuit is in its hold phase when the halved clock signal is in the first logic state and in its track phase in when the halved clock signal is in the second logic state, and wherein each second T/H circuit is coupled to its first ADC through its multiplexer when the halved clock signal is in the first logic state.

12. The apparatus of claim 11, wherein the first logic state is logic high, and wherein the second logic state is logic low.

* * * * *